（12）United States Patent
Chu et al.

(10) Patent No.: US 8,525,278 B2
(45) Date of Patent: Sep. 3, 2013

(54) MEMS DEVICE HAVING CHIP SCALE PACKAGING

(75) Inventors: Chia-Hua Chu, Zhubei (TW); Chung-Hsien Lin, Hsinchu Science Park Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 17 days.

(21) Appl. No.: 13/213,863

(22) Filed: Aug. 19, 2011

(65) Prior Publication Data

US 2013/0043547 A1    Feb. 21, 2013

(51) Int. Cl.
*H01L 27/20*    (2006.01)
*H01L 21/98*    (2006.01)

(52) U.S. Cl.
USPC ............ 257/415; 257/E21.705; 257/E27.006; 438/51

(58) Field of Classification Search
USPC .......... 257/415, 254, 777, E21.705, E27.006; 438/48, 51, 121
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine et al. | |
| 6,664,129 B2 | 12/2003 | Siniaguine et al. | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,453 B2 * | 1/2005 | Mastromatteo | 438/455 |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |

(Continued)

OTHER PUBLICATIONS

Martin Liu; Richard Chu; Hung-Hua Lin; H.T. Huang; Jung-Huei Peng; Yuan-Chin Hsieh; Lan-Lin Chao; Chun-Wen Cheng and Chia-Shiung Tsai; "Wafer Level Packaging Bond;" U.S. Appl. No. 12/729,911; filed Mar. 23, 2010; 19 Pages.

*Primary Examiner* — Victor A Mandala
*Assistant Examiner* — Whitney T Moore
(74) *Attorney, Agent, or Firm* — Haynes and Boone, LLP

(57) ABSTRACT

A method and device having chip scale MEMS packaging is described. A first substrate includes a MEMS device and a second substrate includes an integrated circuit. The frontside of the first substrate is bonded to the backside of the second substrate. Thus, the second substrate provides a cavity to encase, protect or operate the MEMS device within. The bond may provide an electrical connection between the first and second substrate. In an embodiment, a through silicon via is used to carry the signals from the first substrate to an I/O connection on the frontside of the second substrate.

19 Claims, 7 Drawing Sheets

(56) References Cited

U.S. PATENT DOCUMENTS

| | | |
|---|---|---|
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2008/0128901 A1* | 6/2008 | Zurcher et al. ............ 257/724 |
| 2009/0068795 A1* | 3/2009 | Higashi ...................... 438/121 |

* cited by examiner

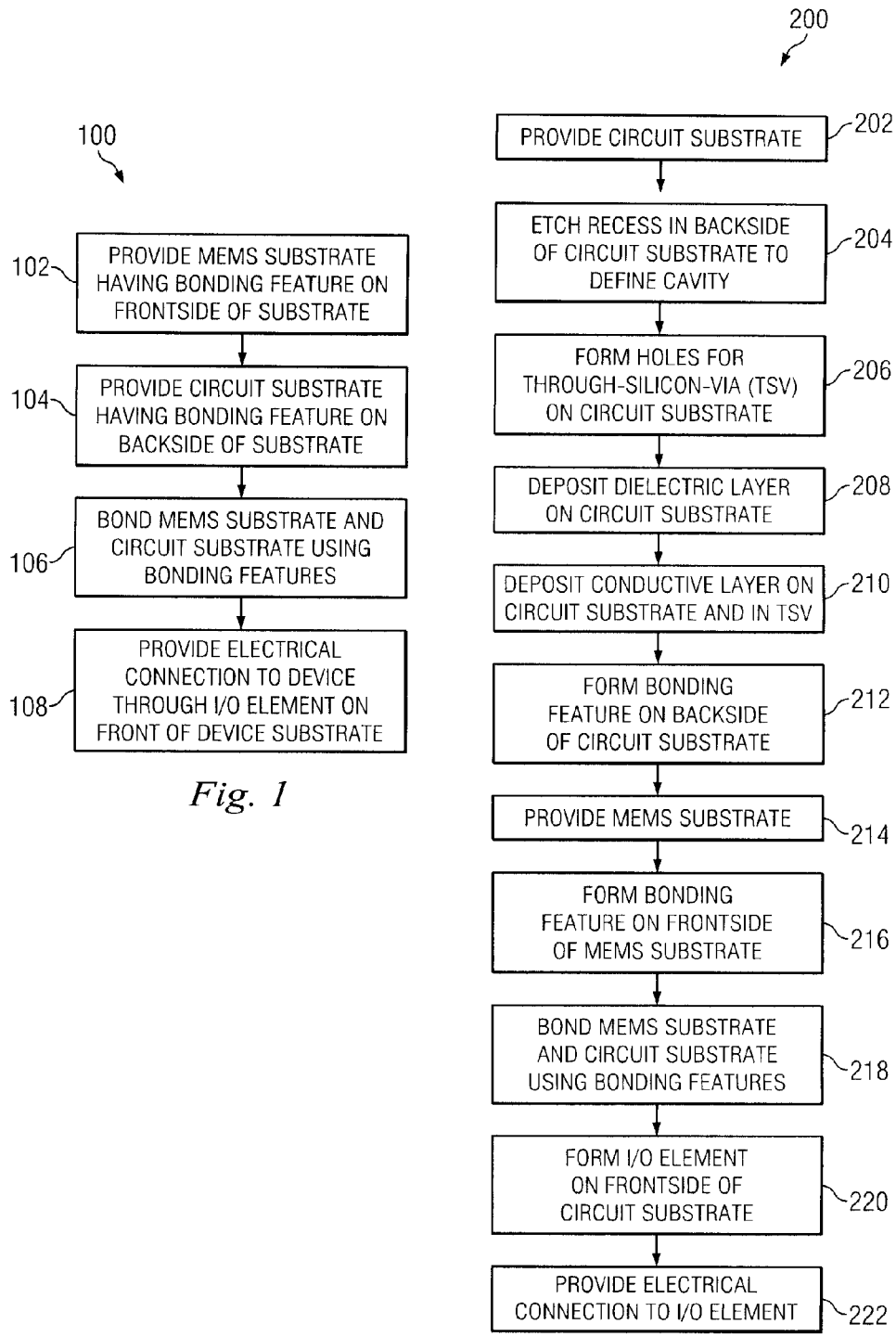

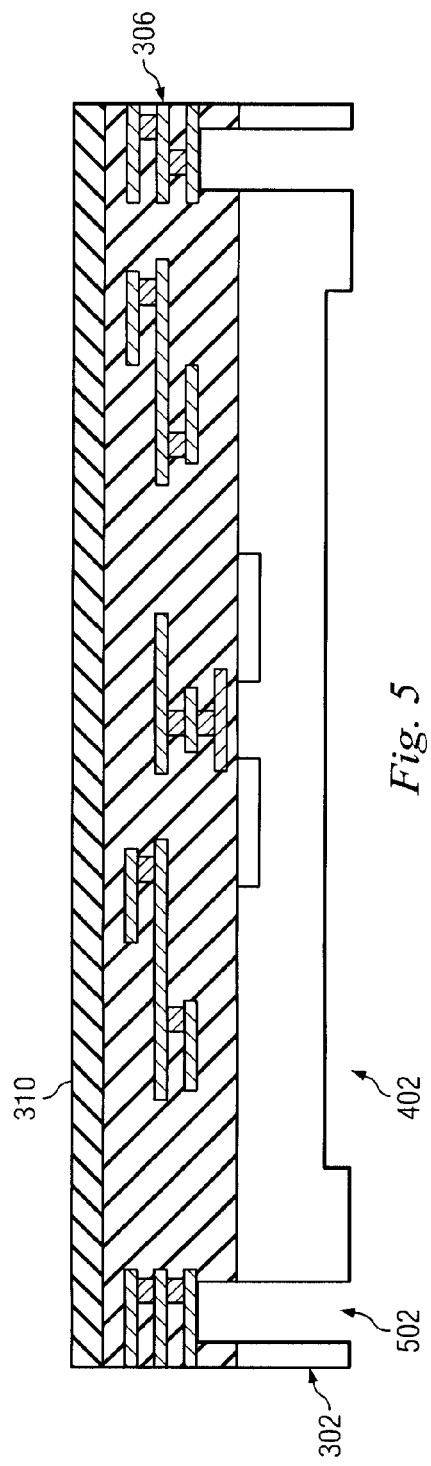
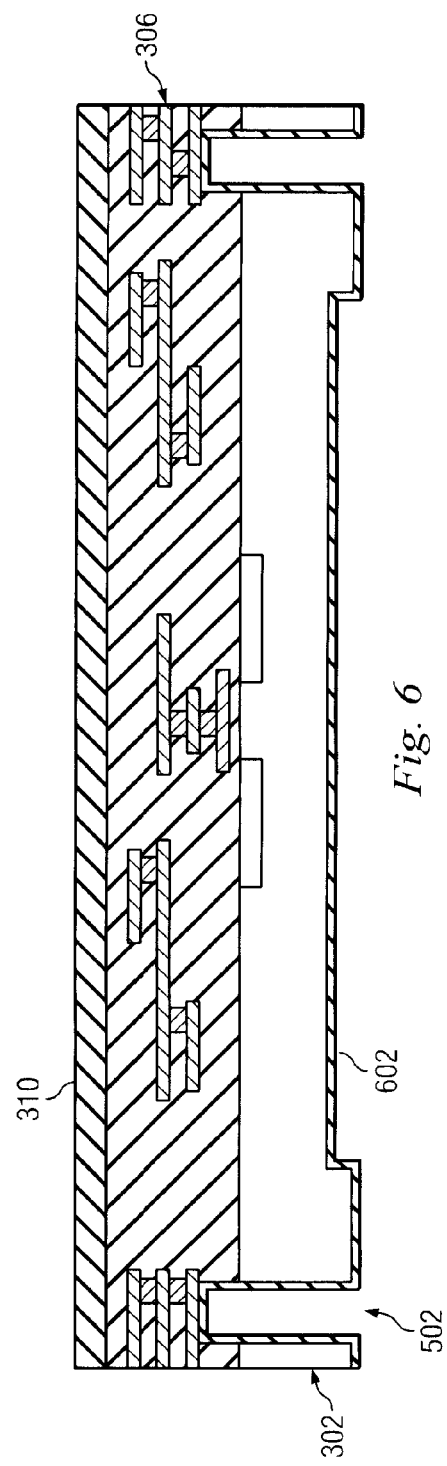

MEMS DEVICE HAVING CHIP SCALE PACKAGING

BACKGROUND

Microelectromechanical systems (MEMS) devices are very small electro-mechanical systems often incorporated into integrated circuit devices. The fabrication and development of products including MEMS devices has experienced numerous challenges including those of integrating the MEMS chips and integrated circuit chips together. Typically the chips may be placed side-by-side and then wire bonded together. This however is time consuming and can provide a product with a large footprint. Wafer-level chip scale packaging of MEMS and CMOS devices is advantageous in that it can reduce packaging and integration costs, however, other issues arise. For example, especially in MEMS devices that require a high vacuum environment, outgassing from layers formed on the CMOS devices can degrade the vacuum environment provided for the MEMS devices. Thus, what is needed is a device and method providing for chip scale packaging of MEMS devices that reduces one or more the present disadvantages.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a flow chart illustrating a method of fabricating a MEMS device according to one or more aspects of the present disclosure.

FIG. 2 is a flow chart illustrating an embodiment of the method of FIG. 1.

FIG. 3-12 are cross-sectional views of portions of the MEMS device during fabrication according to an embodiment of the method of FIG. 2.

DETAILED DESCRIPTION

Figure 3:
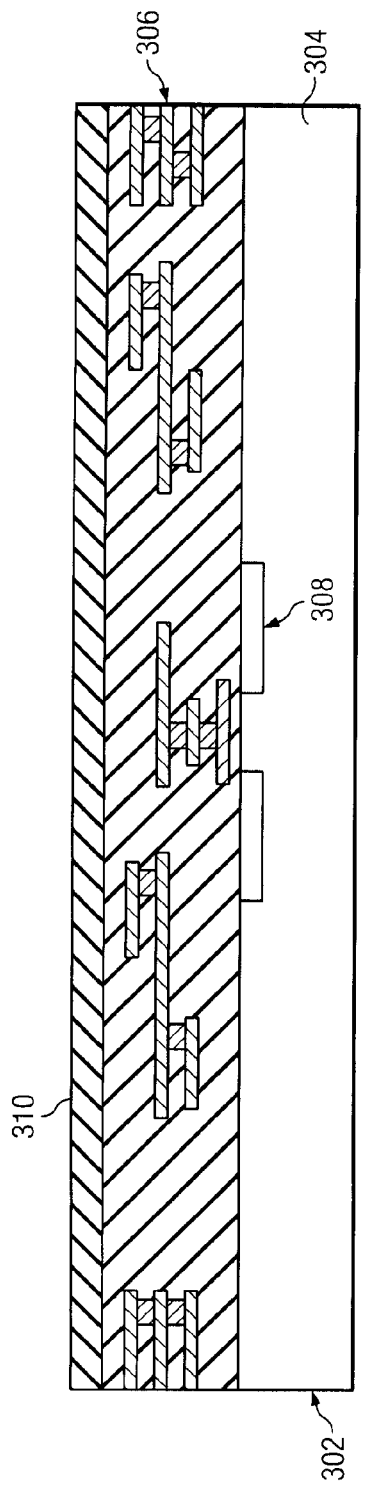
Figure 4:
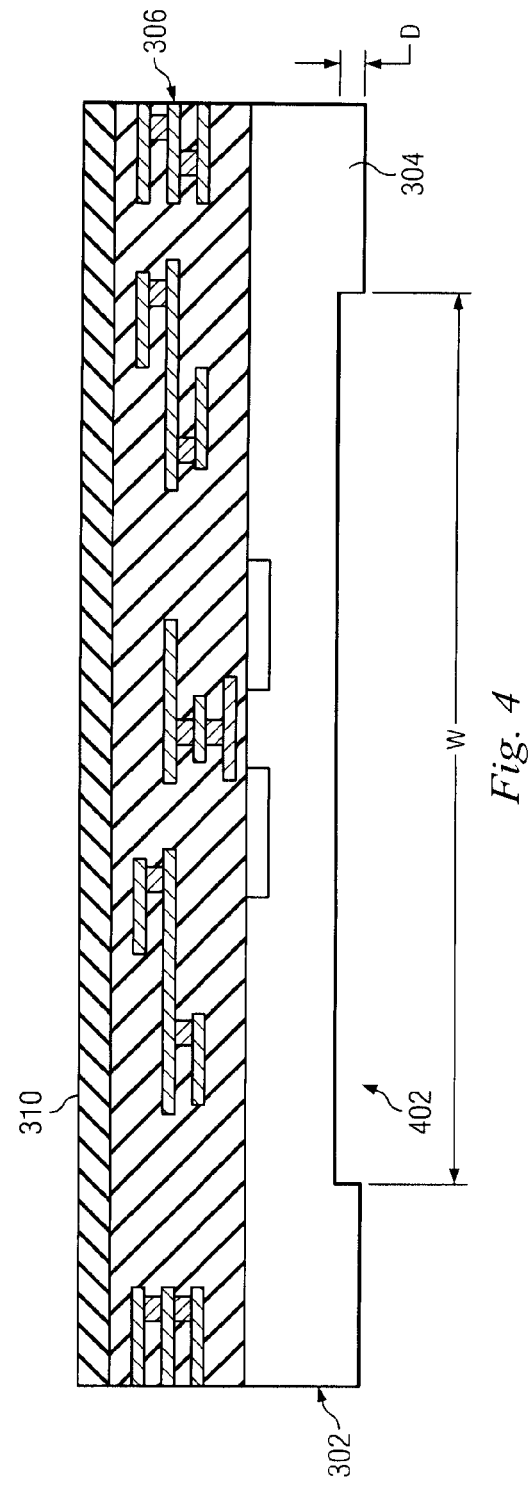
Figure 7:
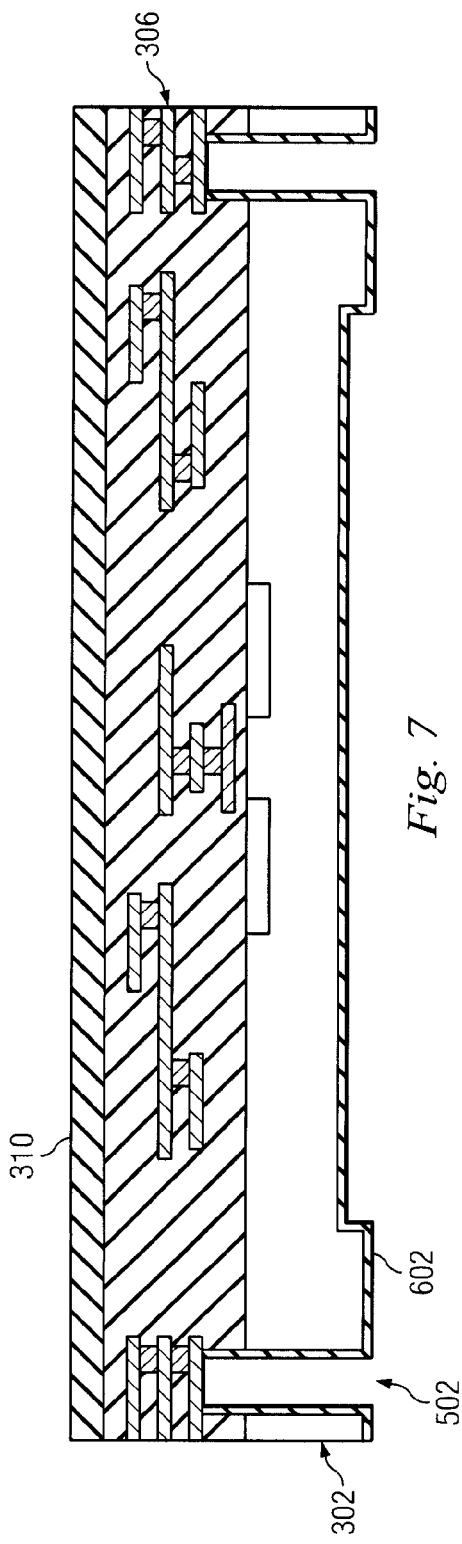

It is to be understood that the following disclosure provides many different embodiments, or examples, for implementing different features of the invention. Specific examples of components and arrangements are described below to simplify the present disclosure. These are, of course, merely examples and are not intended to be limiting.

For example, though one or more methods or devices described herein discuss the bonding of a MEMS substrate (e.g., including a MEMS device) and a circuit substrate, in embodiments, the present disclosure may be applied to any type of substrate coupled with another substrate including substrates having MEMS devices formed thereon or disposed thereON (e.g., bonded thereto), substrates including integrated circuit (IC) devices (e.g., fabricated using CMOS or other suitable processes), substrates including both IC and MEMS devices, various capping substrates, and/or other suitable substrates. Additionally although described as providing for coupling two substrates, any number of substrates may be coupled according to aspects of the present disclosure. Further, though the present disclosure refers to microelectromechanical systems (MEMS) devices, one of ordinary skill in the art will find other applicable technologies that may benefit from the disclosure including, but not limited to, nanoelectromechanical systems (NEMS) devices.

The formation of a first feature "over", "on", "connected" or "coupled to" a second feature, and like descriptive terms, in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. The relative terms "frontside" and "backside" are likewise provided for reference only and not intended to imply an absolute direction. For example, the MEMS device(s) described herein may be oriented in various manners (e.g., flipped over).

Illustrated in FIG. 1 is a flow chart of a method 100 for fabricating a device including a MEMS device. FIG. 1 is an exemplary embodiment of one of the broader forms of the present disclosure. Additional details, descriptions, and alternative embodiments are described with reference to FIG. 2 and the exemplary devices of FIGS. 3-12.

The method 100 begins at block 102 where a MEMS substrate is provided. The MEMS substrate may be any substrate including a MEMS device or component providing a portion thereof. The MEMS substrate may be in wafer form. In an embodiment, the MEMS substrate includes at least one moveable component. The MEMS substrate has a bonding feature (e.g., pad or bonding layer) formed on the frontside of the MEMS substrate. In an embodiment, the MEMS device or portion thereof is also formed on the frontside of the MEMS substrate, The method 100 then proceeds to block 104 where a circuit substrate is provided. The circuit substrate may any substrate including an integrated circuit (IC) device. The circuit substrate may be in wafer form. The IC device may be formed using complementary metal oxide silicon (CMOS) processes and/or other suitable semiconductor device fabrication processes. The circuit substrate includes a bonding feature (e.g., pad or bonding layer) formed on the backside of the circuit substrate. In an embodiment, a semiconductor device (e.g., transistor) is formed on the frontside of the substrate. The semiconductor device may be connected to a multi-layer interconnect (MLI) structure also formed on the frontside of the circuit substrate. The MLI structure may include a plurality of metal, or otherwise conductive, lines and vias. A passivation layer may be formed on a top subsurface of the frontside of the circuit substrate.

The bonding features of the MEMS and/or circuit substrate may include aluminum, gold, copper, and/or other suitable conductive material. The bonding features may provide means for mechanical and/or electrical coupling of the respective substrate.

The method 100 then proceeds to block 106 where the MEMS substrate and the circuit substrate are bonded, using the bonding features described above. The process may include eutectic bonding. However, other processes may be suitable. The bonding provides an electrical and/or mechanical connection between the MEMS and circuit substrates.

By bonding the backside of the circuit substrate interfacing the frontside of the MEMS substrate, it is possible for the circuit substrate to define a cavity above and around a MEMS device formed on the frontside of the MEMS substrate. Thus, the need for a capping substrate is eliminated in embodiments. As noted above, the bonding features may provide an electrical connection from the MEMS substrate to the circuit substrate. Thus, certain embodiments reduce or eliminate the need for additional I/O connections to the MEMS substrate directly. The electrical signal(s) from the MEMS substrate may be routed through and to the circuit substrate features using through-silicon vias (TSV), though other interconnect methods may also be employed.

The method 100 then proceeds to block 108 where an electrical connection to the device (e.g., bonded substrates) may be provided by an I/O element on the frontside of the circuit substrate. The I/O element may be a pad (e.g., bond pad) formed on a top surface of the frontside of the circuit substrate. The I/O element may be provided in an opening of a passivation layer formed on the surface of the frontside of the circuit substrate. An electrical connection may be provided to the I/O element by wire bonding, bumping, and/or other suitable interconnect technologies.

Thus, the method 100 provides for bonding a circuit substrate and a MEMS substrate such that the backside of the circuit substrate is directly adjacent or interfacing the frontside of the MEMS substrate. Thus, the MEMS device formed on the frontside of the substrate is provided a cavity defined by the backside of the circuit substrate. This allows for a chip scale packaging solution by providing connections to the device through I/O element on the circuit substrate. In other words, an electrical connection to the device may be pulled out from the top side of the circuit substrate, as the MEMS device is interconnected through the circuit wafer.

Referring now to FIG. 2, illustrated is a method 200 that describes an embodiment of the method 100, described above with reference to FIG. 1. FIGS. 3-12 are cross-sectional views of a device fabricated according to the method 200 of FIG. 2. It is understood that additional steps can be provided before, during, and/or after the method 200, and some of the steps described below can be replaced or eliminated for additional embodiments of the method. It should be further understood that additional features can be added to the device, and/or features omitted from the device, for additional embodiments of the device. The device, shown in various stages, is exemplary only and used for ease of understanding.

The method 200 begins at block 202 where a circuit substrate is provided. The circuit substrate includes various layers and features that can combine to form various microelectronic elements that may include: transistors (for example, metal-oxide-semiconductor field effect transistors (MOSFET) including complementary metal-oxide-semiconductor (CMOS) transistors, bipolar junction transistors (BJT), high voltage transistors, high frequency transistors, p-channel and/or n-channel field effect transistors (PFETs/NFETs)); resistors; diodes; capacitors; inductors; fuses; and/or other suitable elements. The microelectronic elements could be interconnected to one another to form a portion of an integrated circuit device, such as a logic device, memory device (for example, a static random access memory (SRAM)), radio frequency (RF) device, input/output (I/O) device, system-on-chip (SoC) device, other suitable types of devices, or combinations thereof. In an embodiment, the circuit substrate includes an integrated circuit device (or portion thereof) designed and formed by CMOS based processes. A substrate including a device formed using other integrated circuit fabrication technologies is also within the scope of the present disclosure.

The circuit substrate provided may be in wafer form (e.g., including a plurality of dies). In one example, the substrate is a silicon wafer. The circuit substrate may alternatively or additionally include other elementary semiconductors, such as germanium. The substrate may also include a compound semiconductor, such as silicon carbide, gallium arsenic, indium arsenide, and indium phosphide. The circuit substrate may include any plurality of layers formed thereon such as insulating layers, dielectric layers, conductive layers, and/or other suitable materials.

Referring to the example of FIG. 3, a circuit substrate 302 is provided. The circuit substrate 302 may include a semiconductor substrate 304, a multilayer interconnect 306 formed on the semiconductor substrate 304, a semiconductor device 308, and a passivation layer 310. In an embodiment, the semiconductor substrate 304 is silicon. In an embodiment, the MLI structure 306 includes a plurality of conductive lines vertically connected by conductive vias. The conductive lines and/or vias may be interposed by inter-layer dielectric (ILD). Exemplary materials used for the conductive lines and/or vias (or plugs) include aluminum, copper, tungsten, gold, silicides, and/or other conductive materials. Example compositions of the ILD layer(s) include silicon oxide, silicon oxynitride, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In an embodiment, the ILD layer is a high density plasma (HDP) dielectric.

The MLI 306 is coupled to the semiconductor device 308. In an embodiment, the semiconductor device 308 is a transistor or portion thereof (e.g., a gate and/or source/drain). In an embodiment, the passivation layer 310 includes polyimide. In an embodiment, the passivation layer 310 includes SiN.

The substrate 302 includes a frontside and an opposing backside (as does the semiconductor substrate 304). As illustrated in FIG. 3, the frontside of the substrate includes the MLI structure 306 and the semiconductor device 308.

The method 200 then proceeds to block 204 where a recess is etched in the backside of the circuit substrate. The recess may form a portion of the cavity defined between the bonded circuit substrate and a MEMS substrate, described in further detail below. In an embodiment, block 204 is omitted from the method 200. Referring to the example of FIG. 4, a recess 402 is etched in the substrate 302. The material of the base substrate 304 (e.g., silicon) may be etched using suitable wet and/or dry etching processes. The recess 402 may be between approximately 0 μm and approximately 100 μm in depth D. The recess 402 may be between approximately 5 μm and approximately 1 cm in width W.

The method 200 then proceeds to block 206 where a via hole to provide a through-silicon via (TSV) is formed on the circuit substrate. The TSV may serve to provide a connection between the backside of the substrate and one or more features formed on the frontside of the substrate. The process of forming openings, or holes, through the device includes performing an etch (e.g., dry etch(es)) through the semiconductor substrate and a portion of the MLI (including ILD). For example, a silicon etch followed by a metal/oxide etch. Referring to the example of FIG. 5, via holes 502 are formed opening the backside of the substrate 302. The via holes 502 extend from the backside of the substrate 302/304 to a layer of the MLI structure 306.

The method 200 then proceeds to block 208 where a dielectric layer is formed on the substrate and in the via holes for the TSV. Once the openings for the vias are formed, an isolation deposition is performed to form an isolation layer in the via holes. Example materials include, TEOS, SiN, oxide, and/or other suitable materials. In an embodiment, block 208 is omitted. Referring to the example of FIG. 6, a dielectric layer 602 is formed on the substrate 302 including in the via holes 502. The dielectric layer 602 also is formed on the recess 402, however other embodiments are possible. In an embodiment, the dielectric layer includes anti-stiction properties.

After deposition, the dielectric layer may be etched in the via holes. Referring to the example of FIG. 7, the dielectric layer 602 has been etched from the bottom of the via hole 502.

Figure 8:
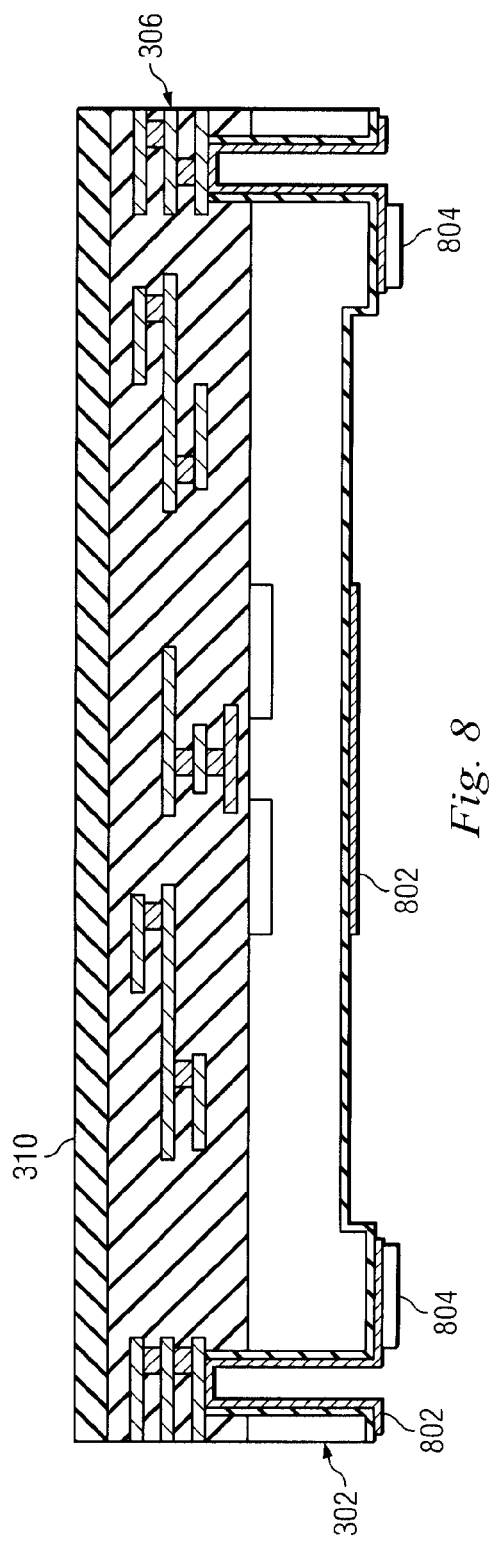

The method 200 then proceeds to block 210 where a conductive layer is formed on the circuit substrate. Specifically, the holes providing the TSV are partially or completely filled with conductive material. Exemplary materials include aluminum, copper, and/or other suitable conductive materials. The conductive layer may include a plurality of layers (e.g., liners). Referring to the example of FIG. 8, a conductive layer 802 is formed in the via hole 502 and on the backside of the substrate 302. Various configurations of the conductive layer 802 are possible and the exemplary embodiment of FIG. 8 is not intended to be limiting. Additionally, the conductive layer 802 may form additional conductive features on the backside of the circuit substrate providing interconnections to the features on the circuit and/or MEM substrate.

The method 200 then proceeds to block 212 where a bonding feature is formed on the backside of the circuit substrate. The bonding feature may be formed on the conductive layer, or portion thereof, described above with reference to block 210. The bonding feature may include suitable material such as gold, copper (Cu), indium (In), aluminum (Al), Tin (Sn), germanium (Ge), titanium (Ti), palladium (Pd), nickel (Ni) and silicon (Si), and proper combinations thereof. The bonding feature may include a material suitable for providing an electrical connection and/or forming a eutectic bond.

Referring to the example of FIG. 8, the bonding feature 804 is formed on the backside of the substrate 302. The bonding feature 804 may be referred to as a pad. The bonding feature 804 may be formed by depositing a layer of conductive material and patterning the material to form a pad. The bonding feature may include suitable material such as gold, copper (Cu), indium (In), aluminum (Al), Tin (Sn), germanium (Ge), titanium (Ti), palladium (Pd), nickel (Ni) and silicon (Si), and proper combinations thereof. The bonding feature 804 may be formed by plating, physical vapor deposition (PVD), chemical vapor deposition (CVD), evaporation, electron beam evaporation (E-gun), ion beam, energy beam, combinations thereof, and/or other suitable deposition processes. The deposited material may be patterned using photolithography and other suitable processes.

The method 200 then proceeds to block 214 where a MEMS substrate is provided. The MEMS substrate includes at least one MEMS device disposed thereon. The MEMS device may be fabricated on the substrate or fabricated and subsequently coupled (e.g., bonded) to the substrate. Exemplary MEMS devices include components forming a motion sensor (for example, a gyroscope or an accelerometer, a resonator, an RF MEMS device (for example, an RF switch or filter), an oscillator, a MEMS microphone, a bio MEMS, and/or any other MEMS type device, including later developed MEMS devices. The MEMS device as referred to herein does not necessitate a final, functional device but a portion thereof, such as any component providing mechanical movement. The MEMS substrate may be in wafer form.

Figure 9:
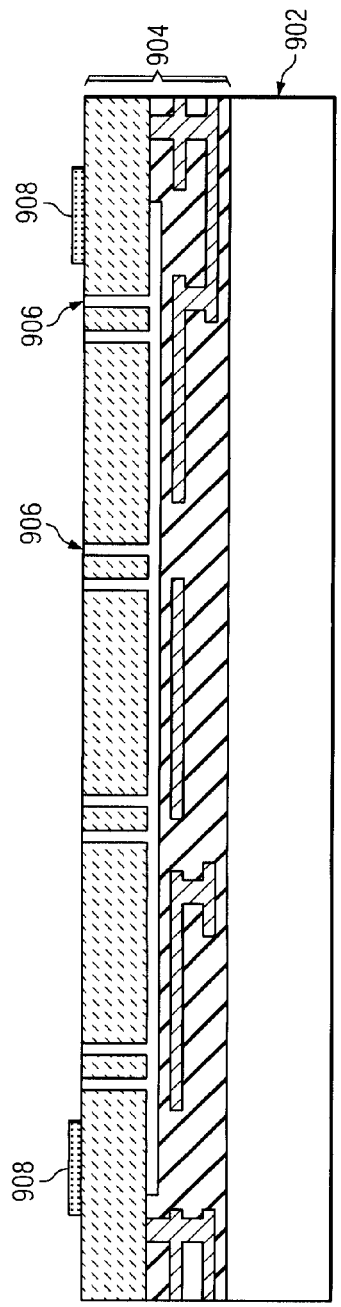

Referring to the example of FIG. 9, a MEMS substrate 902 is provided. The MEMS substrate 902 includes a device layer 904. The device layer 904 may include the portion of the MEMS substrate 902 including MEMS devices, circuits associated with MEMS devices, and the like. The MEMS substrate 902 includes a MEMS device 906. The MEMS device 906 may be one or more components which together form portions of a motion sensor (for example, a gyroscope or an accelerometer, a resonator, an RF MEMS device (for example, an RF switch or filter), an oscillator, a microphone, bio MEMS, and/or other MEMS device. The MEMS device 906 includes a moveable component formed in a micro-scale (e.g., 1 to 1000 μm in size).

The method 200 then proceeds to block 216 were a bonding feature is formed on the frontside of the MEMS substrate. The bonding feature may be suitable to provide mechanical and/or electrical connection to the MEMS substrate. Exemplary bonding feature materials include gold, copper (Cu), indium (In), aluminum (Al), Tin (Sn), germanium (Ge), titanium (Ti), palladium (Pd), nickel (Ni) and silicon (Si), and/or proper combinations thereof. The suitable materials includes those conductive materials providing an electrical connection and/or suitable for eutectic bonding. The bonding feature may be referred to as a pad. In embodiments, additional features may be formed on the top surface of the frontside of the MEMS substrate such as a top electrode. These features may be formed concurrently with, or separately from, the bonding feature.

Referring to the example of FIG. 9, a bonding feature (or pad) 908 is formed on the MEMS substrate 902. The bonding feature 908 is formed on the frontside of the MEMS substrate 902, the side including the device layer 904 and the MEMS device 906. The bonding feature 908 may be formed by plating, physical vapor deposition (PVD), chemical vapor deposition (CVD), evaporation, electron beam evaporation (E-gun), ion beam, energy beam, combinations thereof, and/or other suitable deposition processes. The deposited material may be patterned using photolithography and other suitable processes.

The method 200 then proceeds to block 218 where the MEMS substrate and the circuit substrate are bonded. The bonding of the MEMS substrate and the circuit substrate form a gap or cavity between the MEMS devices and the backside of the circuit substrate. The cavity may provide a controlled environment (e.g., vacuum). The bonding of the MEMS substrate and the circuit substrate may also provide an electrical connection path between the MEMS substrate and the circuit substrate. The bonding of the MEMS substrate and the circuit substrate may be accomplished by the interface of the bonding features on the respective substrate, described above. In an embodiment, the bonding features on the respective substrates are bonded by eutectic bonding, though other embodiments are possible. The bonding features may provide a ring (e.g., seal ring) which defines the cavity including the MEMS device.

Figure 10:
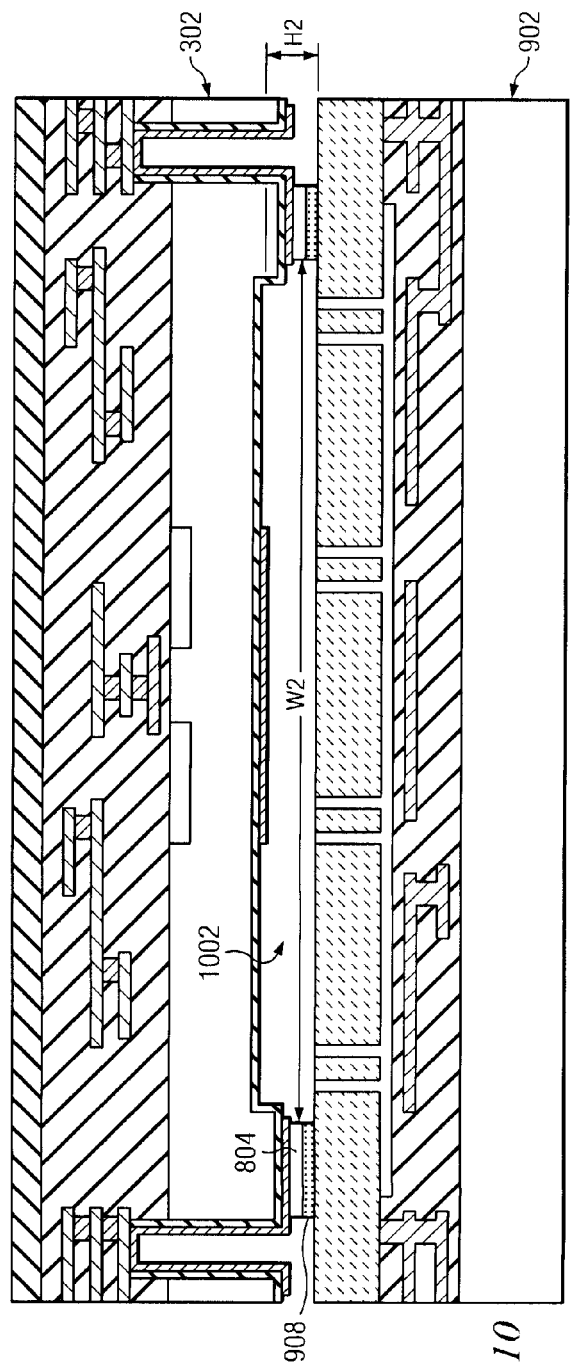

Referring to the example of FIG. 10, the MEMS substrate 902 and the circuit substrate 302 are bonded together. The bonding feature 908 is bonded to the bonding feature 804. The bonding features may form a eutectic bond which defines the cavity 1002. In an embodiment, the cavity 1002 is under vacuum pressure. The cavity 1002 may be between approximately 0.1 μm and approximately 100 μm in height H2. The cavity 1002 may be between approximately 5 μm and approximately 1 cm in width W2. However, other embodiments are possible. It is noted that the thickness of the bonding feature 908 and/or the bonding feature 804 can control the height of the cavity 1002. In an embodiment, an electrical connection between features on the MEMS substrate 902 and features on the circuit substrate 302 is provided by the bonding features 908 and the bonding feature 804.

In an embodiment, substrates may be bonded using a eutectic (wetting) bonding process, though other techniques are possible. The eutectic reaction is achieved by heating the connective elements or bonding layer(s) to their eutectic temperature, the temperature at which a combination of the connective elements or bonding layers initially forms a liquid or molten state (eutectic state). The materials at the interface of the connective elements or bonding layers then diffuse together to form an alloy composition—or a eutectic alloy layer. Alternatively, the bonding between the substrates may be achieved by thermal compressive bonding, thermal diffusion bonding, and/or other suitable manners. The bonding process may be performed in the presence of a forming gas and/or another controllable environment. Example forming gases include argon, nitrogen ($N_2$), hydrogen ($H_2$), nitrogen/hydrogen mixture, and/or other suitable gases. In an embodiment, a surface clean is performed prior to the bonding process. The surface clean may include a wet etch (e.g., HF), a dry etch (e.g., argon sputtering and plasma etch processes), or combinations thereof. The bonding may be performed by a commercially available wafer bonder, and an alignment process is typically performed prior to the bonding process.

The method 200 then proceeds to block 220 where an I/O element is formed on the frontside of the circuit substrate. In an embodiment, the I/O element is referred to as a bond pad. The bond pad may include gold, copper (Cu), indium (In), aluminum (Al), Tin (Sn), germanium (Ge), titanium (Ti), palladium (Pd), nickel (Ni), silicon (Si), and/or other suitable conductive materials. The bond pad may be an I/O bond pad providing connection to one or more elements or features disposed on the substrate (e.g., elements of an IC). The bond pad may be connected to an interconnect, or portion thereof, such as a multi-level interconnect including conductive lines and vias of an IC. In an embodiment, the bond pad may be formed with the MLI structure and included in the MLI structure. Thus, the I/O element provides a means to "pick up" the electrical signal from the circuit substrate. Forming the I/O element includes opening the passivation layer and providing a connection to the MLI. Thus, the I/O element may provide an electrical connection to the circuit substrate, as well as the MEMS substrate (e.g., via the TSV).

Figure 11:
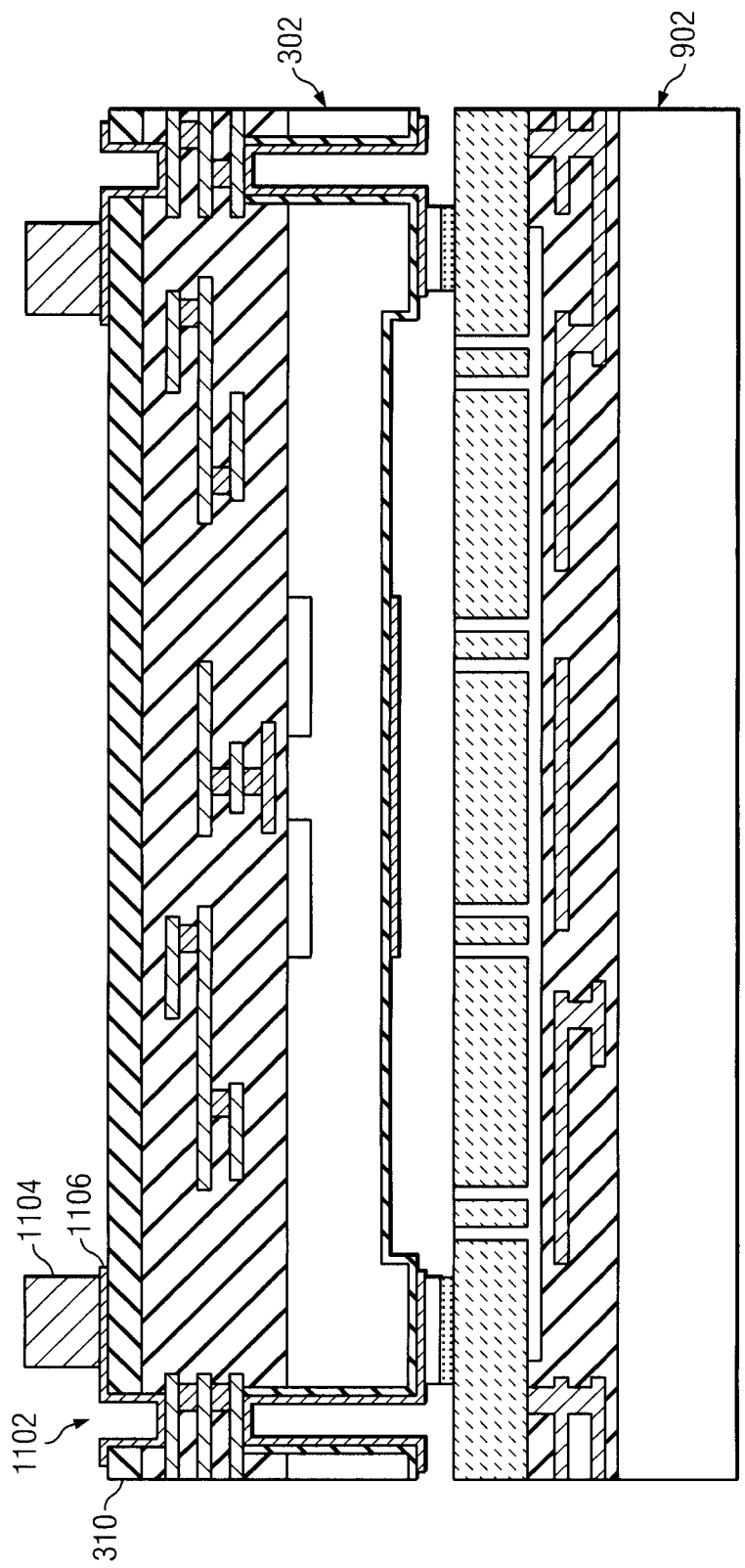
Figure 12:
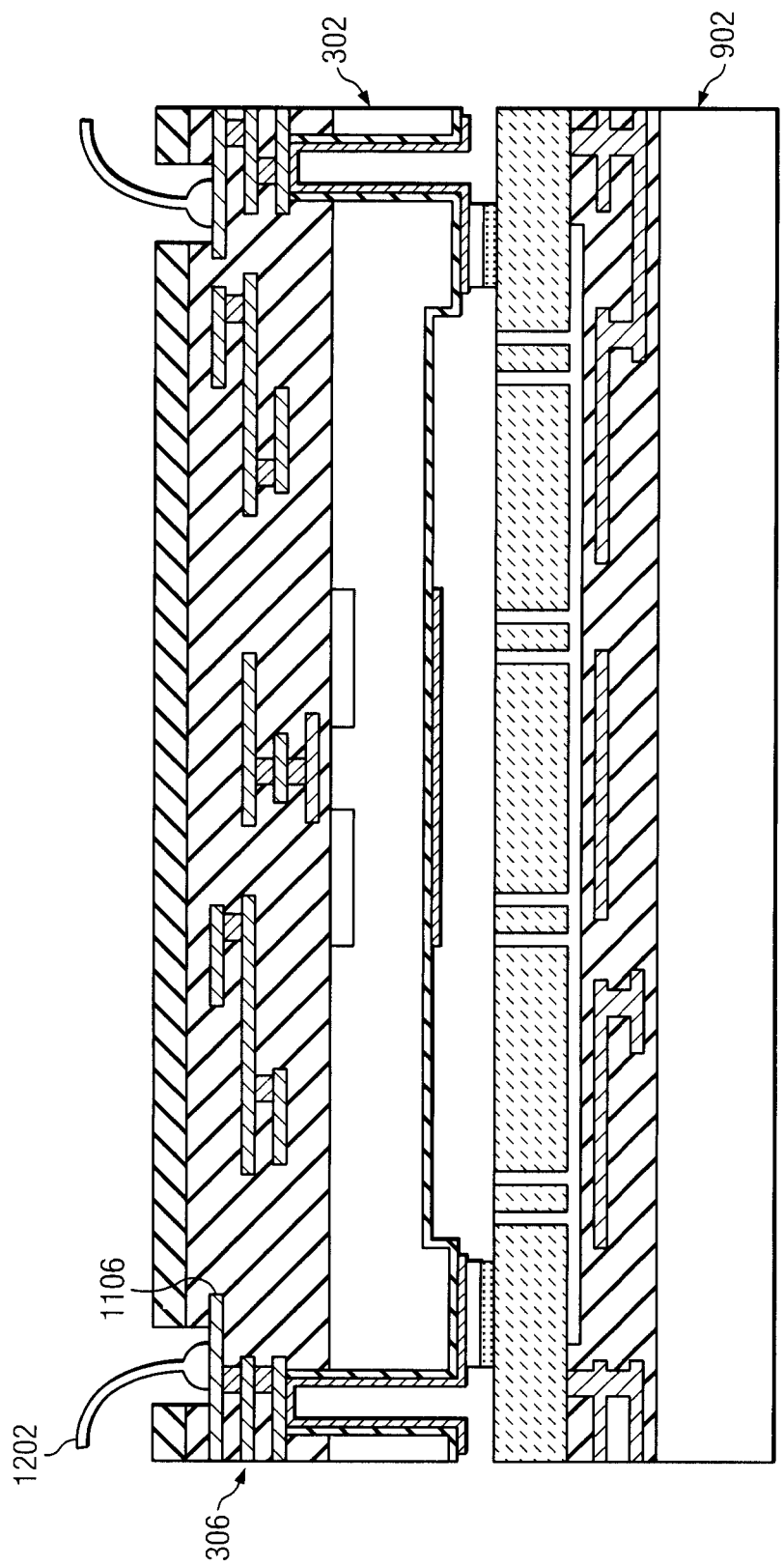

Referring to the example of FIGS. 11 and 12, openings 1102 are formed in the passivation layer 310. FIG. 11 illustrates a conductive bump 1104 (e.g., solder bump) formed on a conductive layer 1106 coupled to the MLI 306. The conductive layer 1106 may provide a conductive pad (e.g., bond pad). FIG. 12 illustrates a wire bond 1202 formed the conductive layer 1106, which is provided as a portion of the MLI 306. The conductive layer 1106 may provide a conductive pad (e.g., bond pad).

In summary, the methods and devices disclosed herein provide for a chip-scale packaging of a MEMS device. In doing so, the present disclosure offers several advantages over prior art devices. Advantages of the present disclosure include a reduction in outgassing, which may contaminate or otherwise be detrimental to the environment in a cavity including the MEMS device (e.g., vacuum). It is understood that different embodiments disclosed herein offer different disclosure, and that they may make various changes, substitutions and alterations herein without departing from the spirit and scope of the present disclosure.

What is claimed is:

1. A device, comprising:
   a first substrate having a MEMS device disposed on a frontside of the first substrate;
   a second substrate including an integrated circuit (IC) and having a frontside and an opposing backside, wherein the IC includes a multi-layer interconnect (MLI) structure, wherein the MLI structure includes:
      a first conductive line,
      a second conductive line overlying the first conductive line,
      a conductive via connecting the first and second conductive line,
      a dielectric material interposing the first and second conductive lines;
   and wherein the second substrate further includes a through-silicon via (TSV) extending from the backside of the second substrate to the first conductive line;
   wherein a first bonding feature on the frontside of the first substrate is bonded to a second bonding feature on a backside of the second substrate; and wherein the TSV connects the second bonding feature and the first conductive line.

2. The device of claim 1, wherein the second substrate further includes a recess formed in the backside of the second substrate.

3. The device of claim 1, wherein the bonded first bonding feature and the bonded second bonding feature form a seal ring surrounding a cavity, wherein the MEMS device is disposed in the cavity.

4. The device of claim 1, wherein the second substrate includes an input/output (I/O) pad formed on the frontside of the second substrate, wherein the I/O pad is electrically connected to the MLI structure.

5. The device of claim 4, wherein at least one of a wire bond and a bump are connected to the I/O pad.

6. The device of claim 1, further comprising:
   a dielectric layer disposed on the backside of the second substrate including underlying the first bonding element.

7. The device of claim 6, wherein the dielectric layer is formed on the backside of the second substrate and not the frontside of the second substrate.

8. A method, comprising:
   providing a first substrate having a MEMS device disposed on a frontside of the first substrate;
   providing a second substrate including an integrated circuit and having a backside and an opposing frontside, wherein a multilayer interconnect (MLI) structure is disposed on the frontside of the second substrate, wherein the MLI structure includes a plurality of conductive lines interposed by dielectric material;
   forming a first bonding feature on the frontside of the first substrate;
   forming a second bonding feature on the backside of second substrate;
   forming a through-silicon via (TSV) on the second substrate connecting the second bonding feature and the conductive lines of the MLI structure, wherein the forming the TSV on the second substrate includes exposing a bottom surface of the one of the conductive lines of the MLI structure, wherein another one of the conductive lines of the MLI structure overlies the one of the conductive lines of the MLI structure; and wherein the TSV provides for connecting the second bonding feature and an I/O pad formed on the frontside of the second substrate; and
   providing an electrical connection between the first substrate and the second substrate by connecting the first bonding feature and the second bonding feature.

9. The method of claim 8, further comprising:
   wire bonding to the I/O pad formed on the frontside of the second substrate.

10. The method of claim 8, further comprising:
    forming a conductive bump on the I/O pad formed on the frontside of the second substrate.

11. The method of claim 8, further comprising:
    etching a recess in the backside of the second substrate prior to providing the electrical connection.

12. The method of claim 8, further comprising:
forming a layer of passivation on a surface of the frontside of the second substrate.

13. The method of claim 8, wherein the connecting the first bonding feature and the second bonding feature forms a cavity between the frontside of the first substrate and the backside of the second substrate, and wherein the MEMS device is disposed in the cavity.

14. The method of claim 13, wherein the cavity is between approximately 0.1 microns and approximately 100 microns in height.

15. A method, comprising:
providing a first substrate having a MEMS device disposed on a frontside of the first substrate;
providing a second substrate including features of a circuit formed on a frontside of the second substrate;
etching a recess in a backside of the second substrate;
forming a dielectric layer on the backside of the second substrate including in the etched recess; and
bonding the frontside of the first substrate and the backside of the second substrate such that the MEMS device is disposed a cavity defined by the recess, wherein the dielectric layer lines a surface of the cavity.

16. The method of claim 15, wherein the bonding includes:
forming a first bonding feature on the frontside of the first substrate;
forming a second bonding feature on the backside of the second substrate; and
electrically coupling the first bonding feature to a second bonding feature.

17. The method of claim 15, wherein the bonding includes creating a vacuum environment in the cavity, and wherein the dielectric layer is included in the cavity.

18. The method of claim 15, wherein the bonding includes forming a eutectic bond.

19. The method of claim 15, further comprising:
forming a through silicon via extending from the backside of the second substrate to a conductive surface on the second substrate, prior to forming the dielectric layer; and
after forming the dielectric layer, removing the dielectric layer from the conductive surface on the second substrate.

* * * * *